(12) United States Patent
Huang et al.

(10) Patent No.: US 10,607,808 B2
(45) Date of Patent: Mar. 31, 2020

(54) EXAMINATION CONTAINER AND ELECTRON MICROSCOPE

(71) Applicant: Taiwan Electron Microscope Instrument Corporation, Hsinchu (TW)

(72) Inventors: Tsu-Wei Huang, Hsinchu (TW); Jia-Ling Wu, New Taipei (TW); Shih-Yi Liu, Kaohsiung (TW); Maochan Chang, Zhubei (TW)

(73) Assignee: TAIWAN ELECTRON MICROSCOPE INSTRUMENT CORPORATION, Hsinchu (TW)

( * ) Notice: Subject to any disclaimer, the term of this patent is extended or adjusted under 35 U.S.C. 154(b) by 0 days.

(21) Appl. No.: 16/038,388

(22) Filed: Jul. 18, 2018

(65) Prior Publication Data

US 2019/0080881 A1   Mar. 14, 2019

(51) Int. Cl.
| | |
|---|---|
| *H01J 37/16* | (2006.01) |
| *H01J 37/32* | (2006.01) |
| *H01J 37/26* | (2006.01) |
| *H01J 37/20* | (2006.01) |

(52) U.S. Cl.
CPC .............. *H01J 37/16* (2013.01); *H01J 37/20* (2013.01); *H01J 37/261* (2013.01); *H01J 37/32* (2013.01); *H01J 37/32807* (2013.01); H01J 2237/16 (2013.01); H01J 2237/2001 (2013.01); H01J 2237/2003 (2013.01); H01J 2237/2004 (2013.01); H01J 2237/206 (2013.01);

(Continued)

(58) Field of Classification Search
CPC .... H01J 37/16; H01J 37/261; H01J 37/32807; H01J 2237/16; H01J 2237/2602
USPC ................. 250/440.11, 441.11, 442.11, 443.1
See application file for complete search history.

(56) References Cited

U.S. PATENT DOCUMENTS

| | | | |
|---|---|---|---|
| 2005/0019222 A1* | 1/2005 | Medland | ............... B01L 3/5023 422/400 |
| 2005/0173632 A1* | 8/2005 | Behar | ..................... B01L 3/508 250/311 |

(Continued)

FOREIGN PATENT DOCUMENTS

| | | |
|---|---|---|
| CN | 101013649 A | 8/2007 |
| CN | 104520967 A | 4/2015 |

(Continued)

*Primary Examiner* — Nicole M Ippolito
(74) *Attorney, Agent, or Firm* — Muncy, Geissler, Olds & Lowe, PC

(57) ABSTRACT

An examination container includes a main body, a cover and a carrier stage. The main body has an accommodating trough for holding a sample. The cover is detachably connected to the main body to close the accommodating trough. The cover has a first through-hole penetrating through an outer surface and an inner surface of the cover, and includes a membrane arranging on the inner surface of the cover. The membrane has a second through-hole opposite to the first through-hole for passing an electron beam through the first through hole and the second through hole. The carrier stage is installed in a position corresponding to the second through-hole. The carrier stage is detachably arranged in the accommodating trough for a variety of examination purposes. An electron microscope using the abovementioned examination container is also disclosed.

25 Claims, 8 Drawing Sheets

(52) U.S. Cl.
CPC ............... *H01J 2237/20235* (2013.01); *H01J 2237/2602* (2013.01)

(56) References Cited

U.S. PATENT DOCUMENTS

| | | | |
|---|---|---|---|
| 2006/0171850 A1* | 8/2006 | Waterbury | B01L 3/50255 422/63 |
| 2008/0179538 A1* | 7/2008 | Shan | H01J 37/20 250/442.11 |
| 2013/0313430 A1 | 11/2013 | Ominami et al. | |

FOREIGN PATENT DOCUMENTS

| | | |
|---|---|---|
| TW | 200639901 A | 11/2006 |
| TW | 200723344 A | 6/2007 |
| TW | 201303951 A | 1/2013 |
| WO | WO2014069470 A1 | 5/2014 |

* cited by examiner

EXAMINATION CONTAINER AND ELECTRON MICROSCOPE

BACKGROUND OF THE INVENTION

1. Field of the Invention

The present invention relates to an examination technology using an electron microscope, particularly to an examination container and an electron microscope therewith, which facilitate examining samples at an ambient pressure.

2. Description of the Prior Art

The conventional electron microscope is unlikely to examine samples under an ambient pressure (such as a sample containing a liquid or solid-state component) but can only examine samples in a vacuum environment. So far, an electron microscope technology has been developed to overcome the abovementioned problem, wherein a membrane separates a non-vacuum environment from a vacuum environment, and an electron beam penetrates the membrane. In other words, the space between the membrane and an electron gun is in a vacuum environment, and the space between the membrane and a sample is in a non-vacuum environment. For example, a sample containing a liquid or solid-state component is sealed in an examination container, and the examination container is placed inside an examination chamber of an electron microscope. Thereby, the electron microscope can examine a sample existing at an ambient pressure, such as suspended particles, reacting gas, or a living biological sample.

However, most of the existing examination containers have fixed structure. Therefore, they cannot adapt to all samples or all examination purposes. Thus, the operator must prepare different types of examination containers for different samples or different examination purposes. Consequently, the examination cost increases. Accordingly, an examination container adaptable to various samples and various examination purposes becomes an aim the manufacturers are eager to achieve.

SUMMARY OF THE INVENTION

The present invention provides an examination container and an electron microscope therewith, wherein the carrier stage is detachably installed in the examination container, whereby the examination container can adapt to various samples and various examination purposes, and whereby better examination quality is achieved.

In one embodiment, the examination container of the present invention is placed inside an examination chamber of an electron microscope for examining a sample in the examination container. The examination container includes a main body, a cover and a carrier stage. The main body having an accommodating trough for holding a sample. The cover detachably connected to the main body to seal the accommodating trough, and the cover has a first through-hole penetrating an outer surface and an inner surface of the cover. The cover includes a membrane disposed on the inner surface of the cover. The membrane has a second through-hole corresponding to the first through-hole. an electron beam can pass the first through-hole and the second through-hole. The carrier stage is disposed at a position corresponding to the second through-hole and is detachably installed in an accommodating trough. Thereby, the examination container can adapt to a variety of examination purposes.

In one embodiment, the electron microscope of the present invention includes an examination chamber, an electron beam generator, an examination container and a detector. The examination chamber defines a vacuum environment. The electron beam generator interconnects with examination chamber, generating an electron beam inside the examination chamber. The examination container is placed inside the examination chamber and bombarded by the electron beam. The examination container includes a main body, a cover and a carrier stage. The main body has an accommodating trough for holding a sample. The cover can be detachably connected to the main body to seal the accommodating trough. The cover has a first through-hole penetrating an outer surface and an inner surface of the cover and a membrane disposed on an inner surface of the cover. The membrane has a second through-hole corresponding to the first through-hole. A charged particle bream is able to pass the first through-hole and the second through-hole. The carrier stage is disposed at a position corresponding to the second through-hole and is detachably installed in the accommodating trough, whereby the examination container can adapt to a variety of examination purposes. The detector detects a response to the bombarding of the electron beam on the sample and converts the response into electronic signals.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1A:
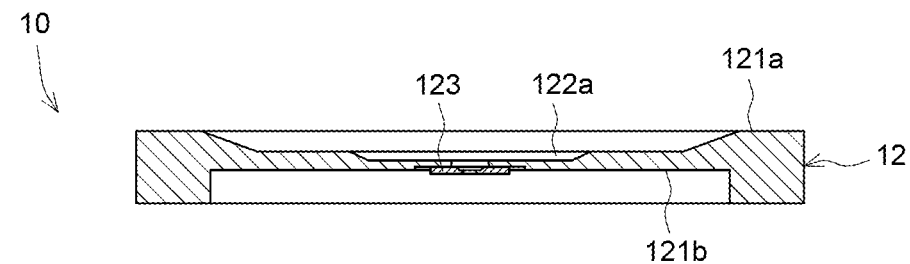
FIG. 1a is an exploded view schematically showing an examination container according to a first embodiment of the present invention.
Figure 1A:
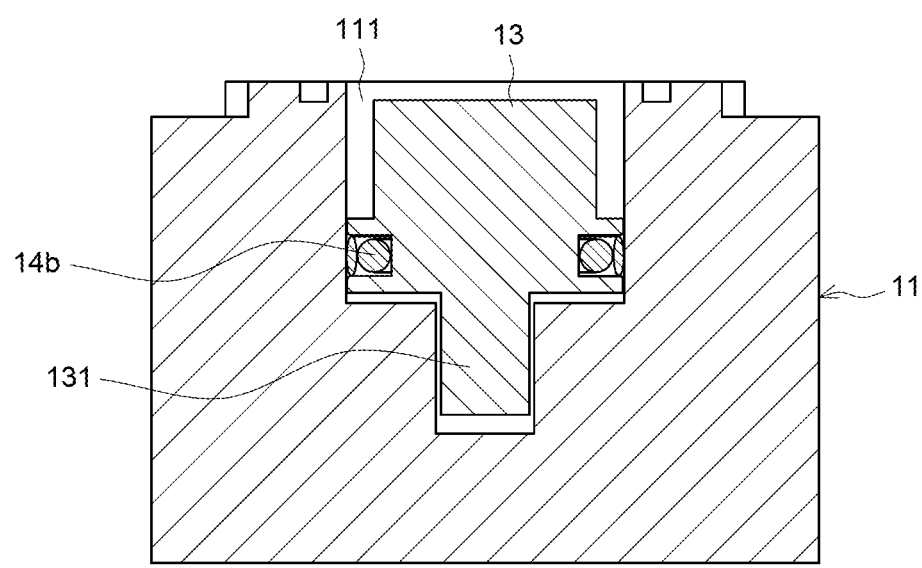

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

The examination container of the present invention is placed inside an examination chamber of an electron microscope for examining a sample in the examination container. Refer to FIG. 1a, FIG. 1b, FIG. 2 and FIG. 3. In one embodiment, the examination container 10 comprises a main body 11, a cover 12 and a carrier stage 13. The main body 11 has an accommodating trough 111 for holding a sample of suspended particles or a living biological sample. In one embodiment, the main body 11 is made of a stainless steel. The cover 12 is detachably connected to the main body 11 to seal the accommodating trough 111. In one embodiment, the cover 12 is made of a stainless steel. In one embodiment, the cover 12 may be rotated with respect to the main body 11 and locked to the main body 11 to prevent from that the sample leakage out of the accommodating trough 111. In one embodiment, corresponding threads are respectively formed on the cover 12 and the main body 11, whereby the cover 12 can be rotated with respect to the main body 11 and engaged with the main body 11. In one embodiment, an O-ring 14a is disposed between the main body 11 and the cover 12 to seal the accommodating trough 111 more effectively.

Figure 1B:
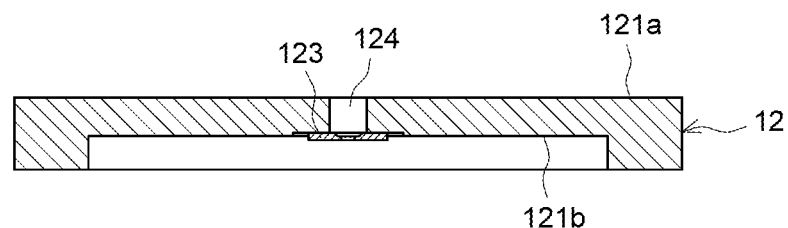
FIG. 1b is a diagram schematically showing a cover of an examination container according to another embodiment of the present invention.
Figure 2:
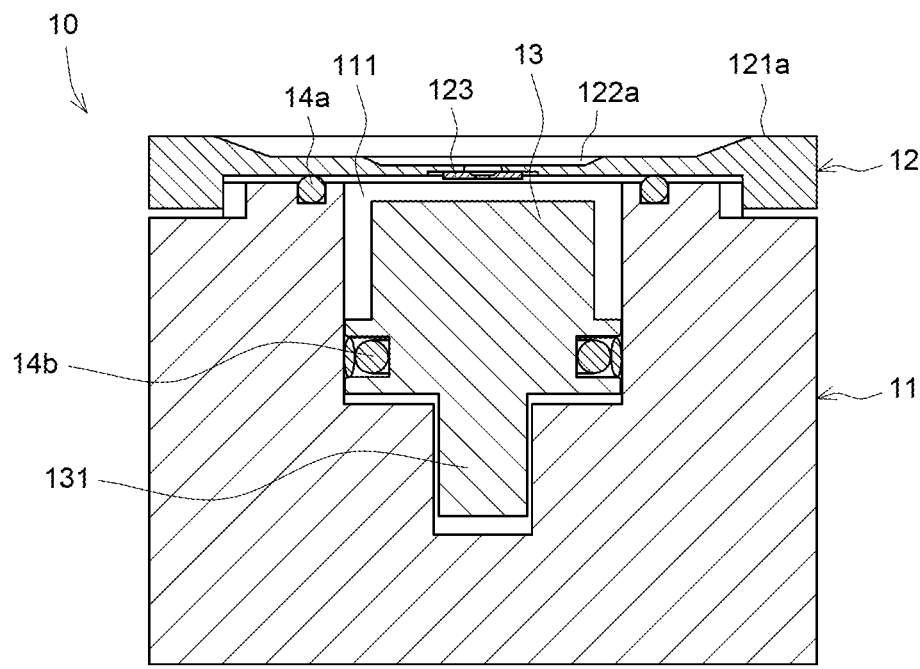
FIG. 2 is an assembly drawing schematically showing an examination container according to the first embodiment of the present invention.
Figure 3:
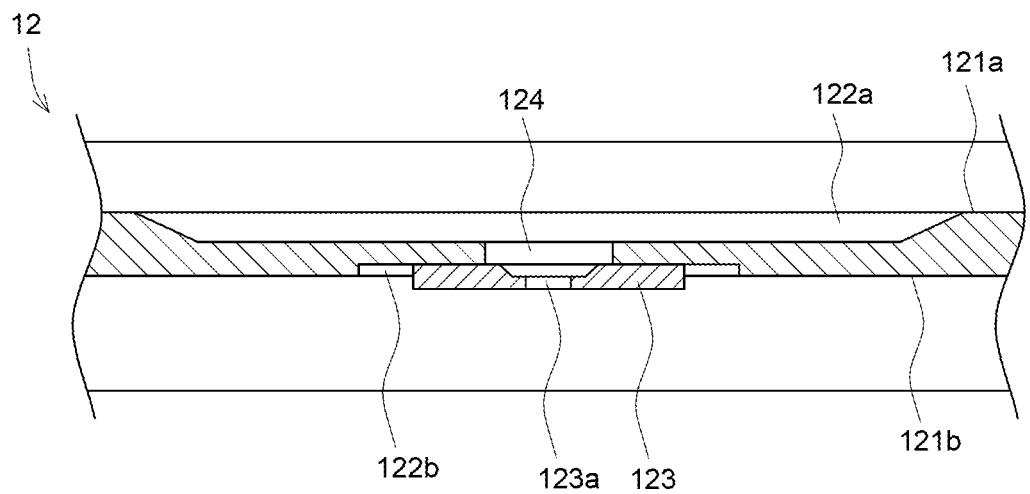
FIG. 3 is a locally-enlarged view schematically showing an examination container according to one embodiment of the present invention.

Refer to FIG. 3, the cover 12 includes a first through-hole 124 and a membrane 123. The first through-hole 124 penetrates an outer surface 121a and an inner surface 121b of the cover 12. Next, shown in FIG. 1a, the cover 12 includes a thinned region, and the first through-hole 124 is within the coverage of the thinned region. In the thinned region, the height of the sidewall of the first through-hole 124 is decreased. For example, a first trough 122a is formed on the outer surface 121a of the cover 12, and the first through-hole 124 is formed on the bottom of the first trough 122a, whereby the height of the sidewall of the first through-hole 124 is decreased. Refer to FIG. 1b. In one embodiment, no thinned region is formed on the cover 12. In other words, the height difference between the outer surface 121a and the inner surface 121b is constant. It is noted that the sidewall of the first through-hole 124 may impair reception of signals. In one embodiment, the ratio of the height of the sidewall of the first through-hole 124 to the width of the first through-hole 124 is less than or equal to 0.7. The membrane 123 is disposed on the inner surface 121b of the cover 12. The membrane 123 has a second through-hole 123a corresponding to the first through-hole 124. The electron beam can pass the first through-hole 124 and the second through-hole 123a to bombard the sample inside the accommodating trough 111. It is noted that the membrane 123 may further include a film covering the second through-hole 123a so that the air impermeability of the accommodating trough 111 can be maintained. To simplify the drawings, the film covering on the second through-hole 123a is omitted in the figure. In one embodiment, the membrane 123 is a thin film chip. The material of the thin film chip may be semiconductor nitride, semiconductor oxide, metal oxide, polymer, graphite, graphene, or another appropriate material. In one embodiment, the second through-hole 123a is a circular hole, a rectangular hole, or a slot-like hole. It is understood that the membrane 123 may tolerate greater stress with the second through-hole 123a of a circular hole. In other words, while the pressure is identical, a circular through-hole 123a is allowed to be larger than a rectangular through-hole 123a without breakage of a film covering the through-hole 123a. Therefore, a circular through-hole may acquire a larger detection area. In one embodiment, the sidewall of the second through-hole 123a has stepped heights. As shown in FIG. 3, the second through-hole 123a is larger on the side facing the cover 12 lest the backward scattered charged particles and X-ray photons generated by the sample be blocked by the membrane 123.

The carrier stage 13 is detachably installed inside the accommodating trough 111 of the main body 11 at a position corresponding to the second through-hole 123a of the membrane 123. In other words, the electron beam passes the first through-hole 124 and the second through-hole 123a to bombard the sample on the carrier stage 13. In one embodiment, a positioning pin 131 is formed on the bottom of the carrier stage 13. In installing the carrier stage 13, the positioning pin 131 is aligned to a hole in the accommodating trough 111, and then the carrier stage 13 is pushed into the hole of the accommodating trough 111, whereby is completed the installation of the carrier stage 13. In one embodiment, an O-ring 14b is disposed around the carrier stage 13 to prevent the sample or liquid from entering the bottom of the accommodating trough 111. In one embodiment, the O-ring 14b is a bilayer O-ring. For example, the inner O-ring is made of elastic material, such as rubber material. The outer O-ring is made of abrasion-resistant material or low-friction material, such as polytetrafluoroethylene (Teflon). It is understood that the carrier stage 13 is detachable and may be replaced with a different type of carrier stage 13 to adapt to a different examination purpose. For example, a carrier stage 13 with a different height can be used to adjust the distance between the carrier stage 13 and the membrane 123. The other types of carrier stages 13 will be described below.

Refer to FIG. 3 again, the inner surface 121b of the cover 12 has a second trough 122b, and the membrane 123 is disposed inside the second trough 122b. It is noted that the depth of the second trough 122b is less than the thickness of the membrane 123. Thus, the membrane 123 slightly protrudes from the second surface 121b of the cover 12 to avoid the air pockets stay in the second through-hole 123a repelling the sample or affecting examination. It is understood that in the case where no air pocket exists, such as a case of observing a gas sample, the depth of the second trough 122b is allowed to be greater than the thickness of the membrane 123 to lower the height of the sidewall of the first through-hole 124. In one embodiment, the shape of the second trough 122b is a circle, a rectangle, or a rectangle with rounded corners.

Figure 4:
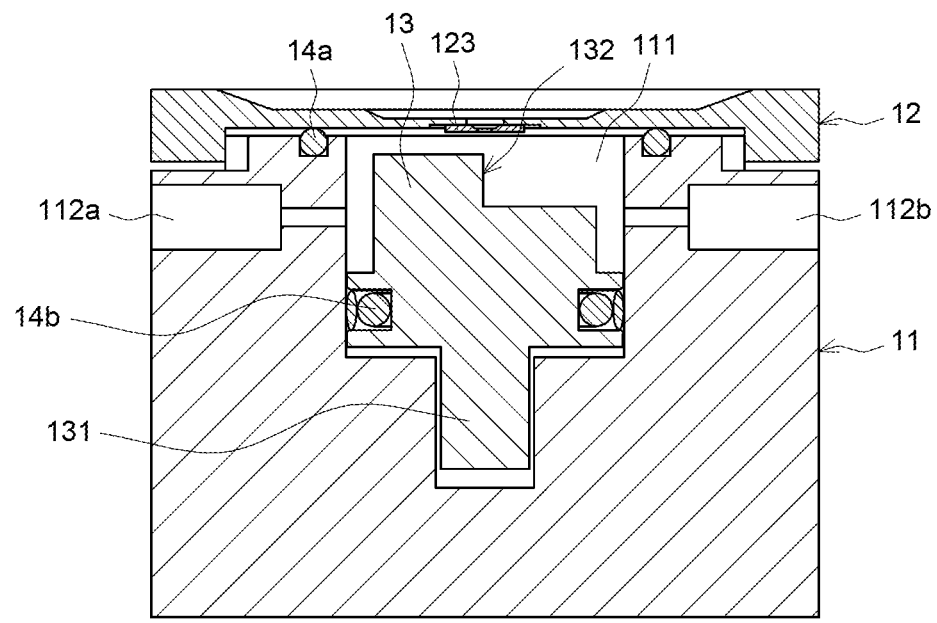
FIG. 4 is a diagram schematically showing an examination container according to a second embodiment of the present invention.

Refer to FIG. 4, the carrier stage 13 has a standing surface 132. For example, the carrier stage 13 has stepped heights, whereby to form the standing surface 132. Therefore, the operator may adopt the carrier stage 13 shown in FIG. 4, whereby the operator can prop the sample against the standing surface 132 to examine the lateral surface of the sample, such as a depth to which an etchant etches a sample. It should be noted: the standing surface 132 is not necessarily a vertical surface. The standing surface may be an inclined surface, whereby the sample can be observed from different angles.

In one embodiment, a fluid inlet 112a and a fluid outlet 112b are formed in the accommodating trough 111. A fluid sample (such as a liquid sample or a gas sample) flows into the accommodating trough 111 via the fluid inlet 112a, passes through the carrier stage 13 for examination, and then flows out of the accommodating trough 111 via the fluid outlet 112b. The distance between the cover 12 and either of the fluid inlet 112a and the fluid outlet 112b is preferably larger than the distance between the cover 12 and the carrier stage 13 to prevent from that air pockets are generated on the top of the accommodating trough 111. It is understood that the operator may introduce etching liquid via the fluid inlet 112a to observe the instant reaction of the sample etched by the etching liquid.

Figure 5:
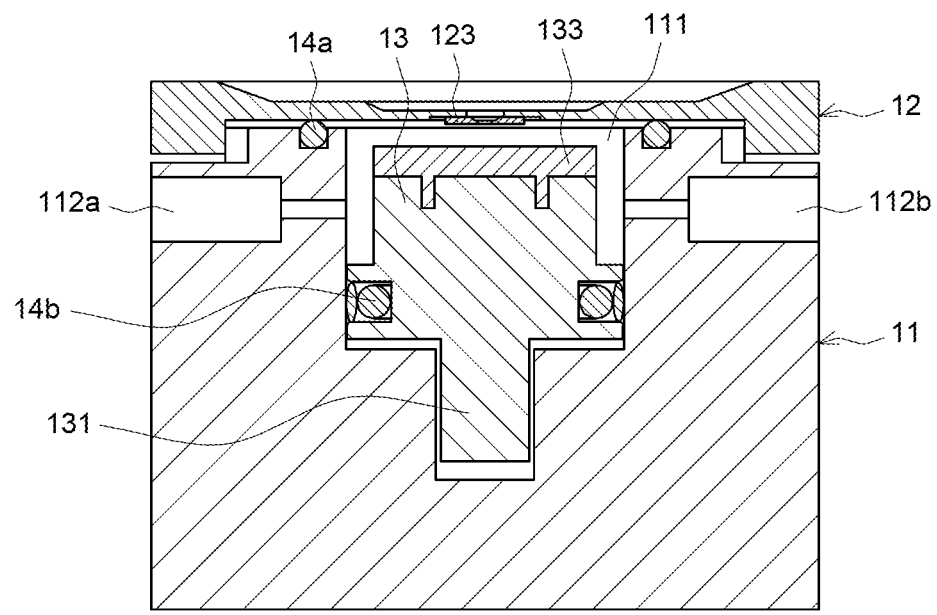
FIG. 5 is a diagram schematically showing an examination container according to a third embodiment of the present invention.

Refer to FIG. 5, a sample pad 133 is detachably disposed on the surface of the carrier stage 13. The sample pad 133 may be a disposable element used in the examination of a high-pollution sample or a hard-to-clean sample. Alternatively, a living biological sample may be cultured on the sample pad 133, and then the sample pad 133 having the living biological sample is placed on the carrier stage 13 for examination. In one embodiment, an appropriate pattern is formed on the sample pad 133 to control the flowing behavior of a fluid sample and favor the examination of the fluid sample.

Figure 6:
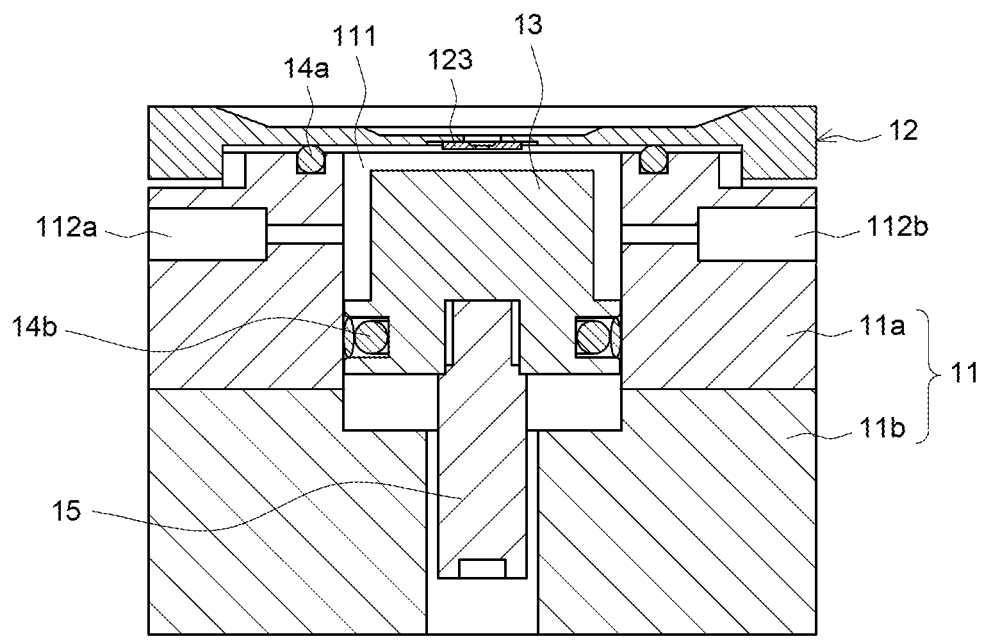
FIG. 6 is a diagram schematically showing an examination container according to a fourth embodiment of the present invention.

Refer to FIG. 6, the examination container of the present invention further includes a height-adjusting element 15 arranged under the carrier stage 13. The height-adjusting element 15 is extended out of the accommodating trough 111, whereby the operator can use the height-adjusting element 15 to adjust the height of the carrier stage 13, i.e. adjust the distance between the carrier stage 13 and the membrane 123, without opening the cover 12 of the examination container. In one embodiment, the height-adjusting element 15 has a thread, and the operator may use an appropriate tool to rotate the height-adjusting element 15 to adjust the distance between the carrier stage 13 and the membrane 123. In the embodiment, the main body 11 includes an upper part 11a and a lower part 11b, and the carrier stage 13 is arranged in the lower part 11b. The accommodating trough 111 is defined via merely assembling the upper part 11a and the lower part 11b together. It is understood that the replacement of the carrier stage 13 for supporting different examination cases may be achieved by replacing the lower part 11b.

Figure 7:
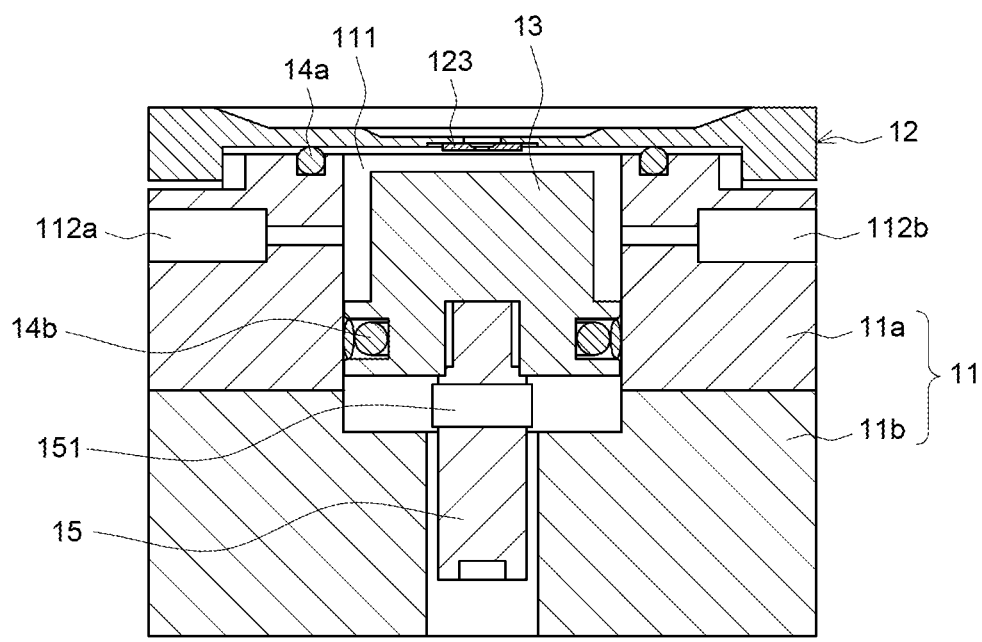
FIG. 7 is a diagram schematically showing an examination container according to a fifth embodiment of the present invention.

The level of the carrier stage 13 significantly influences the examination result. Therefore, it is very important to maintain the carrier stage 13 in level. Refer to FIG. 7, a universal joint 151, such as a universal coupling with spider or a universal ball joint, is arranged to connect the height-adjusting element 15 and the carrier stage 13. Provided that the replacement of the carrier stage 13 causes the carrier stage 13 to tilt, the operator may rise the carrier stage 13 to reach to the cover 12 intimately so as to make the carrier stage 13 parallel to the cover 12 and then descend the carrier stage 13 to an appropriate height for performing examination.

Figure 8:
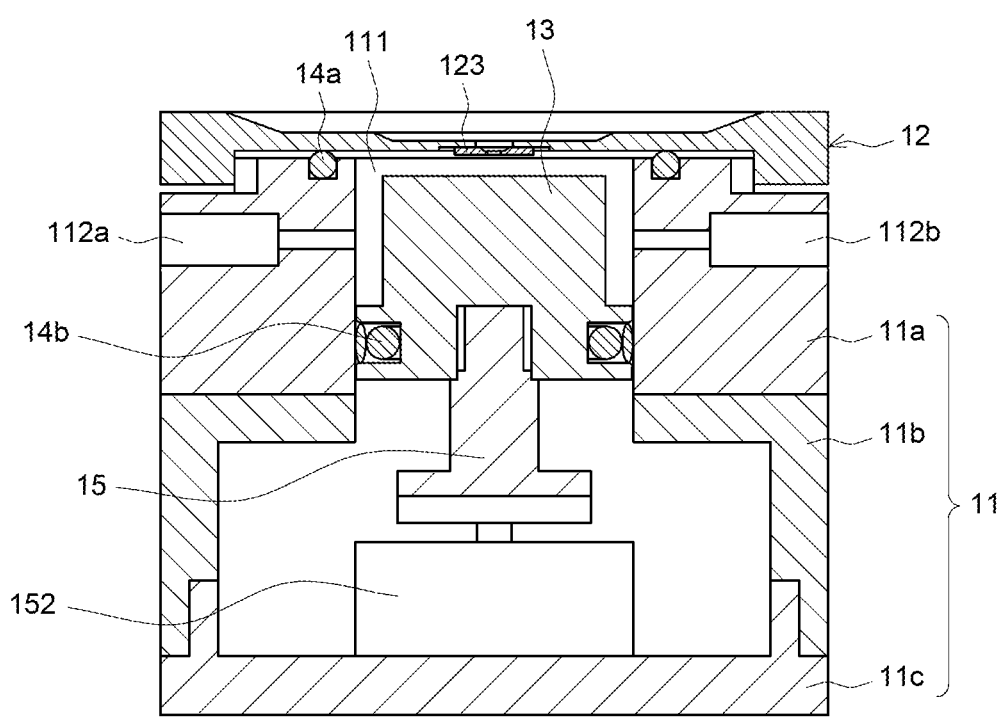
FIG. 8 is a diagram schematically showing an examination container according to a sixth embodiment of the present invention.

In the embodiments shown in FIG. 6 and FIG. 7, the carrier stage 13 is adjusted by the operator manually. Refer to FIG. 8, the height-adjusting element 15 is driven by an electric actuator 152, such as a piezoelectric actuator. It is well known that the piezoelectric actuator can induce very small variation of the height precisely. In the embodiment shown in FIG. 8, the main body 11 includes an upper part 11a and lower parts 11b and 11c. The upper part 11a in FIG. 8 is identical to the upper parts 11a in FIG. 6 and FIG. 7. Therefore, the manual height-adjusting element 15 can be replaced by the electric height-adjusting element 15 or vice versa via changing the lower part.

Figure 9:
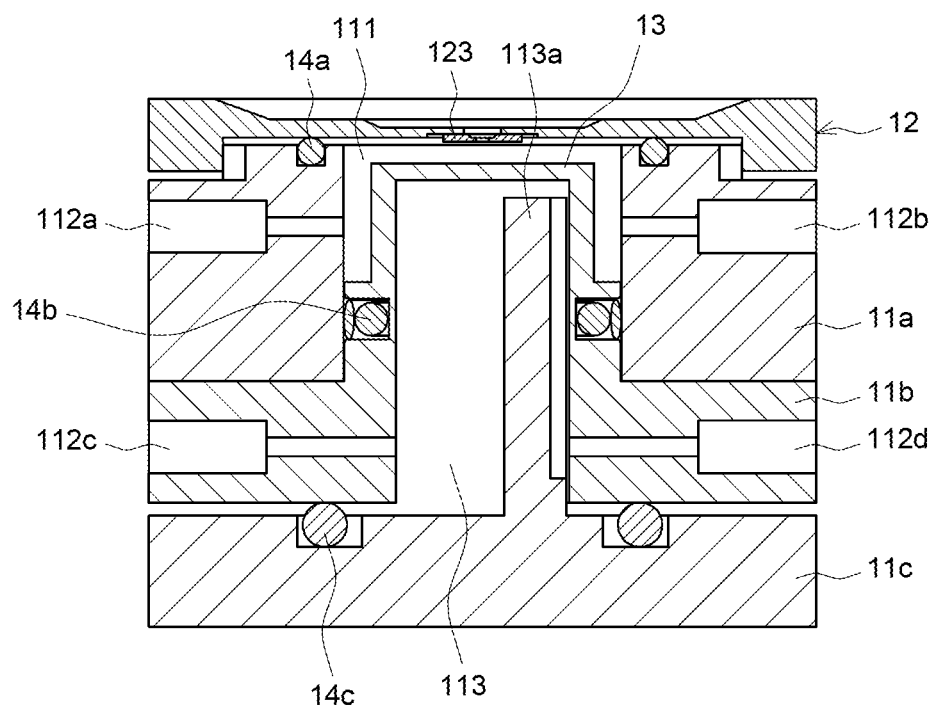
FIG. 9 is a diagram schematically showing an examination container according to a seventh embodiment of the present invention.

Refer to FIG. 9, the carrier stage 13 has a temperature-control channel 113 formed in the lower region of the carrier stage 13. A temperature-control fluid flows into the temperature-control channel 113 via a temperature-control fluid inlet 112c to heat or cool down the sample on the carrier stage 13 and then flows out via a temperature-control fluid outlet 112d. After being heated or cooled down to the desired temperature, the temperature-control fluid may flow into the temperature-control channel again to form a cycling temperature-control system. In one embodiment, a protrusion 113a is disposed inside the temperature-control channel 113, whereby the top region of the temperature-control channel 113, which is near the sample, is fully filled with the temperature-control fluid. In brief, the temperature-control fluid flows into the temperature-control channel 113 via the temperature-control fluid inlet 112c, fills up the temperature-control channel 113 beside the temperature-control fluid inlet 112c firstly and then overflows toward the temperature-control channel 113 near the temperature-control fluid outlet 112d. In the embodiment shown in FIG. 9, the main body 11 also includes an upper part 11a and lower parts 11b and 11c. The upper part 11a in FIG. 9 is identical to the upper parts 11a in FIGS. 6-8. Therefore, a height-adjusting function or a temperature-control function may be provided to the carrier stage 13 via replacing the lower part. In the embodiment shown in FIG. 9, the temperature-control channel 113 is formed via assembling two lower parts 11b and 11c, and an O-ring 14c is arranged in an appropriate position to prevent the temperature-control fluid from leaking out.

Figure 10:
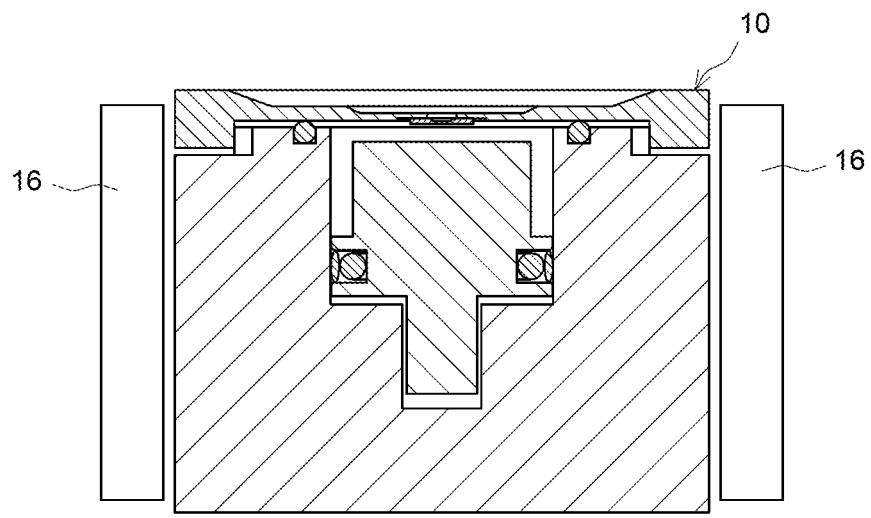
FIG. 10 is a diagram schematically showing an examination container according to an eighth embodiment of the present invention.

Refer to FIG. 10, the examination container 10 includes a temperature-control module 16 disposed outside the main body 11. The temperature-control module 16 can directly heat or cool the main body 11 or the whole examination container 10 to control the temperature of the sample or the examination environment. It is easily understood: the temperature-control module 16 can use a higher temperature, such as a temperature of more than 100 degrees Celsius or even a temperature as high as 300 degrees Celsius, to heat the main body 11 or the whole examination container 10 from exterior.

Figure 11:
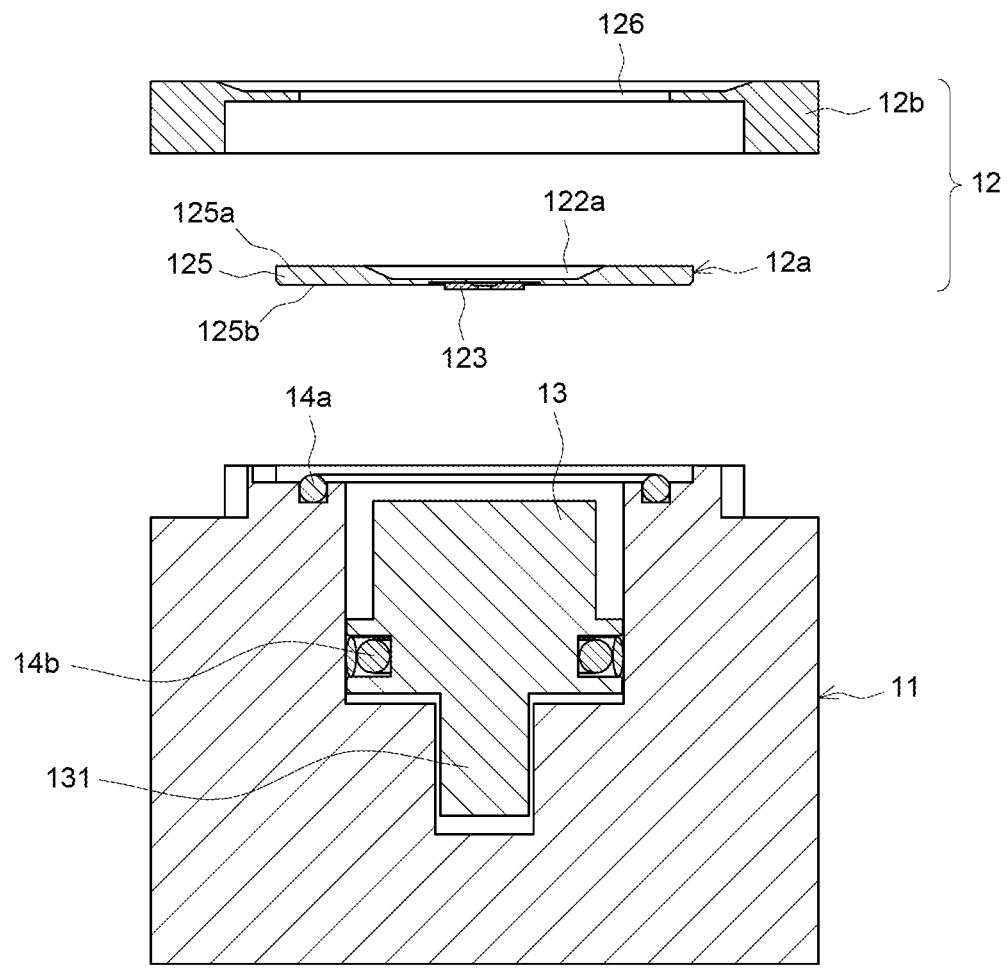
FIG. 11 is a diagram schematically showing an examination container according to a ninth embodiment of the present invention.

Refer to FIG. 11, the cover 12 includes a membrane assembly 12a and a securing member 12b. The membrane assembly 12a covers an opening end of the accommodating trough 111 of the main body 11 to seal the accommodating trough 111. The securing member 12b is detachably connected to the main body 11 and secures the membrane assembly 12a. In one embodiment, the securing member 12b may be rotated with respect to the main body 11 to be locked onto the main body 11 to press the membrane assembly 12b tightly so that the sample leakage out of the accommodating trough 111 is avoided.

Figure 12:
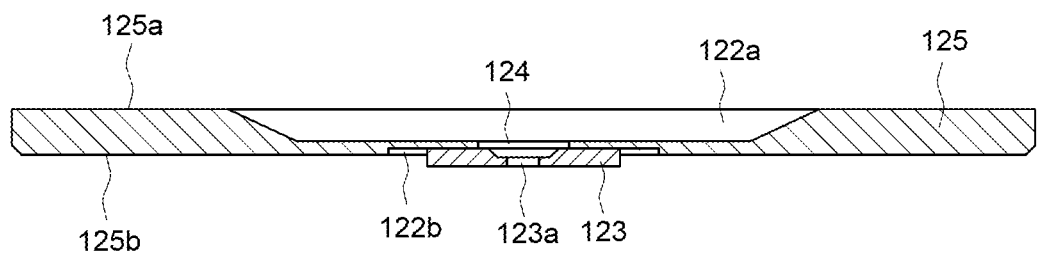
FIG. 12 is a diagram schematically showing a membrane assembly of an examination container according to the ninth embodiment of the present invention.

Refer to FIG. 12, the membrane assembly 12a includes a support body 125 and a membrane 123. The support body 125 has a first surface 125a and a second surface 125b opposite to the first surface 125a. A first trough 122a is formed on the first surface 125a of the support body 125.

The support body 125 is a flat structure, and a first through-hole 124 is formed in the bottom of the first trough 122a. In one embodiment, the support body 125 is made of metallic material, metallic compound material, non-metallic compound material, or polymer material. The metallic material or the metallic compound material may be aluminum, copper, stainless steel or aluminum oxide. The non-metallic compound material may be glass, ceramic, nitride, carbide, or silicide. The polymer material may be plastic or rubber. The membrane 123 is disposed on the second surface 125b of the support body 125. The membrane 123 has a second through-hole 123a corresponding to the first through-hole 124 of the support body 125. an electron beam can pass the first through-hole 124 and the second through-hole 123a to enter the accommodating trough 111 and bombard the sample. In one embodiment, the securing member 12b has a hole 126 formed at an appropriate position in an appropriate size lest the first through-hole 124 of the support body 125 and the second through-hole 123a of the membrane 123 be blocked. In one embodiment, the securing member 12b is made of stainless steel.

In one embodiment, a second trough 122b is formed on the second surface 125b of the support body 125, and the membrane 123 is disposed inside the second trough 122b. The depth of the second trough 122b is smaller than the thickness of the membrane 123. Thereby, the membrane 123 slightly protrudes from the second surface 125b of the support body 125 to avoid air pockets stay in the second through-hole 123a repelling the sample or affecting the examination. According to the abovementioned structure, the operator can rotate the securing member 12b to directly disassemble the securing member 12b for replacing the membrane assembly 12a. Therefore, the present invention enables the operator to replace the damaged membrane 123 easily. As the support body 125 is a flat structure, the operator can take off the membrane 123 from the support body 125 easily and attach a new membrane 123. Therefore, the support body 125 can be recycled and reused. Hence, less material is wasted.

Figure 13:
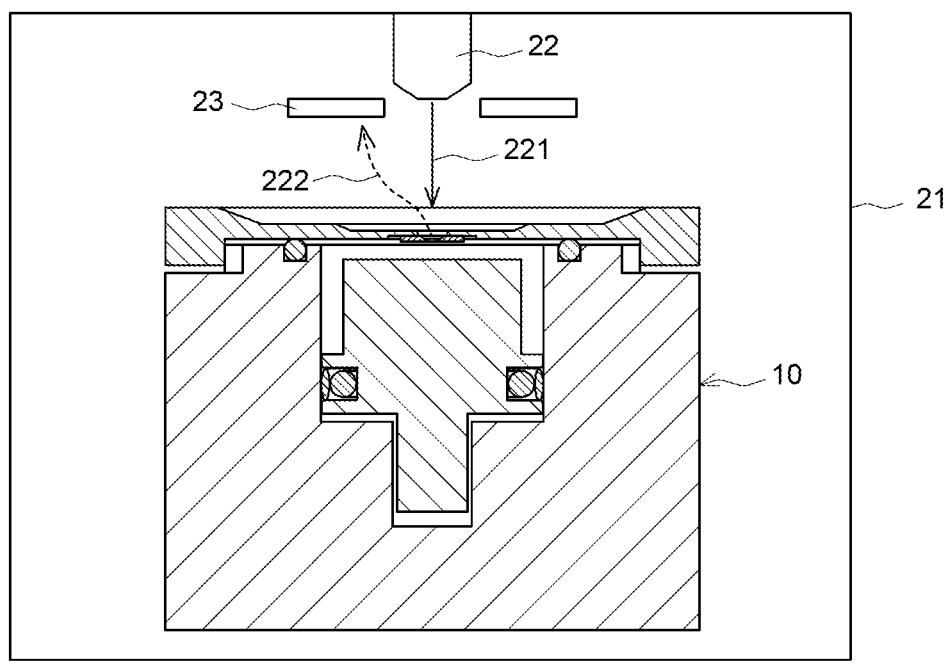
FIG. 13 is a diagram schematically showing an electron microscope according to one embodiment of the present invention.

Refer to FIG. 13. In one embodiment, the electron microscope of the present invention comprises an examination chamber 21, an electron beam generator 22, an examination container 10, and a detector 23. The examination chamber 21 defines a vacuum environment. The electron beam generator 22 interconnects with the examination chamber 21, generating an electron beam 221 inside the examination chamber 21. The examination container 10 is placed inside the examination chamber 21 and bombarded by the electron beam 221. The structure of the examination container 10 has been described in detail above and will not be repeated herein. The detector 23 detects a response 222 to the bombarding of the electron beam 221 on the sample and converts the response 222 into an electronic signal. It is easily understood: the succeeding processing will convert the electronic signal into a microscope image or an X-ray spectrum. In one embodiment, the detector 23 is a charged particle detector, detecting the backward scattered charged particles coming from the sample. In one embodiment, the detector 23 is an energy dispersive X-ray detector to detect the X-rays emitted by the sample bombarded by the electron beam 221. The other components of an electron microscope, such as the signal processor and the power supply, have been well known by the persons having ordinary knowledge in the field. Besides, these components is not the focus of the present invention. Therefore, they will not be repeated herein.

In conclusion, an examination container and an electron microscope are provided herein, wherein the carrier stage is detachably installed inside the examination container. Therefore, the operator may replace the component to achieve a different function of the carrier stage, such as adjusting the height of the carrier stage, adjusting the temperature of the examination environment, standing the sample for examining the lateral side thereof, etc. Hence, the present invention can adapt to a variety of samples and a variety of examination purposes and achieve better examination results.

What is claimed is:

1. An examination container, which is placed inside an examination chamber of an electron microscope for examining a sample in the examination container, comprising:
    a main body having an accommodating trough for holding a sample;
    a cover detachably connected to the main body to seal the accommodating trough, having a first through-hole penetrating an outer surface and an inner surface of the cover, and having a membrane disposed on the inner surface of the cover, wherein the membrane has a second through-hole corresponding to the first through-hole, and wherein an electron beam is able to pass the first through-hole and the second through-hole; and
    a carrier stage disposed at a position corresponding to the second through-hole and detachably installed in the accommodating trough.

2. The examination container according to claim 1, wherein the cover has a thinned region with the first through-hole for decreasing a height of a sidewall of the first through-hole.

3. The examination container according to claim 1, wherein a ratio of a height of a sidewall of the first through-hole to a width of the first through-hole is less than or equal to 0.7.

4. The examination container according to claim 1, wherein the accommodating trough has a fluid inlet and a fluid outlet, and a distance between the cover and either of the fluid inlet and the fluid outlet is larger than one between the cover and the carrier stage.

5. The examination container according to claim 1 further comprising a sample pad detachably disposed on a top surface of the carrier stage.

6. The examination container according to claim 1, wherein the carrier stage has a standing surface, which allows a sample to lean on.

7. The examination container according to claim 1 further comprising a height-adjusting element disposed under the carrier stage to adjust a distance between the carrier stage and the cover.

8. The examination container according to claim 7, wherein a universal joint connects the height-adjusting element and the carrier stage.

9. The examination container according to claim 7, wherein the height-adjusting element is driven by electric power.

10. The examination container according to claim 1, wherein the carrier stage has a temperature-control channel configured to allow a temperature-control fluid to flow thereinside.

11. The examination container according to claim 1 further comprising a temperature-control module disposed outside the main body.

12. The examination container according to claim 1, wherein a sidewall of the second through-hole has stepped heights.

13. The examination container according to claim 1, wherein the cover includes:
 a membrane assembly covering an opening end of the accommodating trough and including:
 a support body having a first surface, a second surface opposite to the first surface, and a first through-hole formed on the first surface, wherein the support body is a flat structure; and
 a membrane disposed on the second surface of the support body; and
 a securing member detachably connected to the main body for securing the membrane assembly.

14. An electron microscope, comprising:
 an examination chamber defining a vacuum environment;
 an electron beam generator interconnecting with the examination chamber and generating an electron beam inside the examination chamber;
 an examination container placed inside the examination chamber, bombarded by the electron beam, and comprising:
 a main body having an accommodating trough for holding a sample;
 a cover detachably connected to the main body to seal the accommodating trough, having a first through-hole penetrating an outer surface and an inner surface of the cover, and having a membrane disposed on the inner surface of the cover, wherein the membrane has a second through-hole corresponding to the first through-hole, and wherein the electron beam is able to pass the first through-hole and the second through-hole; and
 a carrier stage disposed at a position corresponding to the second through-hole and detachably installed in the accommodating trough; and
 a detector detecting a response to bombarding of the electron beam on the sample and converting the response into an electronic signal.

15. The electron microscope according to claim 14, wherein the cover has a thinned region with the first through-hole for decreasing a height of a sidewall of the first through-hole.

16. The electron microscope according to claim 14, wherein a ratio of a height of a sidewall of the first through-hole to a width of the first through-hole is less than or equal to 0.7.

17. The electron microscope according to claim 14, wherein the accommodating trough has a fluid inlet and a fluid outlet, and wherein a distance between the cover and either of the fluid inlet and the fluid outlet is larger than a distance between the cover and the carrier stage.

18. The electron microscope according to claim 14, wherein the examination container further includes a sample pad detachably disposed on a top surface of the carrier stage.

19. The electron microscope according to claim 14, wherein the carrier stage has a standing surface, which allows a sample to lean on.

20. The electron microscope according to claim 14, wherein the examination container further includes a height-adjusting element disposed under the carrier stage to adjust a distance between the carrier stage and the cover.

21. The electron microscope according to claim 20, wherein a universal joint is connected with the height-adjusting element and the carrier stage.

22. The electron microscope according to claim 20, wherein the height-adjusting element is driven by electric power.

23. The electron microscope according to claim 14, wherein the carrier stage has a temperature-control channel, and wherein the temperature-control channel allows a temperature-control fluid to flow thereinside.

24. The electron microscope according to claim 14, wherein the examination container further includes a temperature-control module disposed outside the main body.

25. The electron microscope according to claim 14, wherein a sidewall of the second through-hole has stepped heights.

* * * * *